United States Patent
Cavallaro et al.

(10) Patent No.: US 11,716,806 B1
(45) Date of Patent: Aug. 1, 2023

(54) PROCESSOR HEAT DISSIPATION IN A STACKED PCB CONFIGURATION

(71) Applicant: Motorola Mobility LLC, Chicago, IL (US)

(72) Inventors: Alberto R Cavallaro, Northbrook, IL (US); Maninder S Sehmbey, Hoffman Estates, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 17/529,645

(22) Filed: Nov. 18, 2021

(51) Int. Cl.
| H05K 1/02 | (2006.01) |
| H05K 7/20 | (2006.01) |
| H05K 1/14 | (2006.01) |
| G06F 1/20 | (2006.01) |

(52) U.S. Cl.
CPC ............. *H05K 1/0203* (2013.01); *G06F 1/20* (2013.01); *H05K 1/144* (2013.01); *H05K 7/2039* (2013.01); *H05K 7/20336* (2013.01)

(58) Field of Classification Search
CPC .. H05K 1/0203; H05K 1/144; H05K 7/20336; H05K 7/2039; H05K 1/182; H05K 1/185; H05K 1/181; H05K 3/4611; H05K 1/0206; H05K 1/0207; H05K 1/02; H05K 1/11; H05K 1/14; H05K 2201/042; H05K 2201/0723; H05K 2201/10515; H05K 3/0061; G06F 1/20; G06F 1/16; H01L 2224/16145; H01L 25/0657; H01L 2225/06589; H01L 2225/06541; H01L 25/18; H01L 2924/14
See application file for complete search history.

(56) References Cited

U.S. PATENT DOCUMENTS

| 7,345,885 B2 | 3/2008 | Boudreaux et al. | |
| 7,595,992 B2* | 9/2009 | Koga | G06F 1/203 174/15.1 |
| 8,345,423 B2 | 1/2013 | Campbell et al. | |
| 2002/0008963 A1* | 1/2002 | DiBene, II | H05K 3/368 361/720 |
| 2002/0057554 A1* | 5/2002 | Dibene, II | G06F 1/182 361/720 |
| 2002/0149095 A1* | 10/2002 | Eldridge | H01L 25/105 257/E25.023 |
| 2011/0205709 A1 | 8/2011 | Yin et al. | |

(Continued)

Primary Examiner — Michael A Matey
(74) Attorney, Agent, or Firm — FIG. 1 Patents

(57) ABSTRACT

In aspects of processor heat dissipation in a stacked PCB configuration, a computing device includes a processor for executable instructions processing during which the processor generates heat. The computing device also includes a main printed circuit board (PCB) in a stacked PCB configuration, and the processor is affixed to the main printed circuit board. The stacked PCB configuration forms an enclosed cavity through which heat dissipation is restricted. The computing device includes a heat spreader having a first end connected to the processor via the main printed circuit board by a conductive material, and a second end connected to a heat sink located external to the stacked PCB configuration. The heat spreader exits the enclosed cavity via an opening in the enclosed cavity between the stacked PCB configuration, and the heat spreader transfers the heat away from the processor to the heat sink.

19 Claims, 5 Drawing Sheets

(56) References Cited

U.S. PATENT DOCUMENTS

| | | | |
|---|---|---|---|
| 2014/0015106 A1* | 1/2014 | Hsieh | H01L 23/427 |
| | | | 257/618 |
| 2015/0313017 A1* | 10/2015 | Johnson | H05K 1/111 |
| | | | 174/262 |
| 2015/0342023 A1* | 11/2015 | Refai-Ahmed | H05K 1/0203 |
| | | | 29/829 |
| 2017/0077643 A1* | 3/2017 | Zbinden | G02B 6/4268 |
| 2019/0372203 A1* | 12/2019 | Su | H01Q 1/246 |
| 2021/0112685 A1* | 4/2021 | Magi | G06F 1/203 |
| 2022/0346233 A1* | 10/2022 | Kuwajima | H05K 1/18 |
| 2022/0418080 A1* | 12/2022 | Ma | H05K 1/0203 |
| 2023/0030748 A1* | 2/2023 | Pope | G06F 1/203 |

* cited by examiner

PROCESSOR HEAT DISSIPATION IN A STACKED PCB CONFIGURATION

BACKGROUND

A computing device implements a processor, which executes instructions and generates heat in the process. Excess heat, however, can interfere with the operation of the computing device. For this reason, the computing device needs to be cooled. In basic architectures, a computing device implements a printed circuit board (PCB) that is attached to the processor. To cool this basic architecture, a heat sink located on the external surface or periphery of the computing device is used to transfer heat away from the printed circuit board. New and smaller circuit architectures reduce the footprint in electronic devices, and may include an integrated stacked PCB, in which the printed circuit boards are arranged in a stacked configuration, and the processor may be attached to a side of one of the printed circuit boards. Although a stacked PCB architecture facilitates reducing the overall size of a device, such as when implemented in a mobile device, cooling the processor and other components becomes a difficult challenge, and heat can be trapped inside the stacked PCB architecture.

BRIEF DESCRIPTION OF THE DRAWINGS

Implementations of the techniques for processor heat dissipation in a stacked printed circuit board (PCB) configuration are described with reference to the following Figures. The same numbers may be used throughout to reference like features and components shown in the Figures.

DETAILED DESCRIPTION

Figure 1:
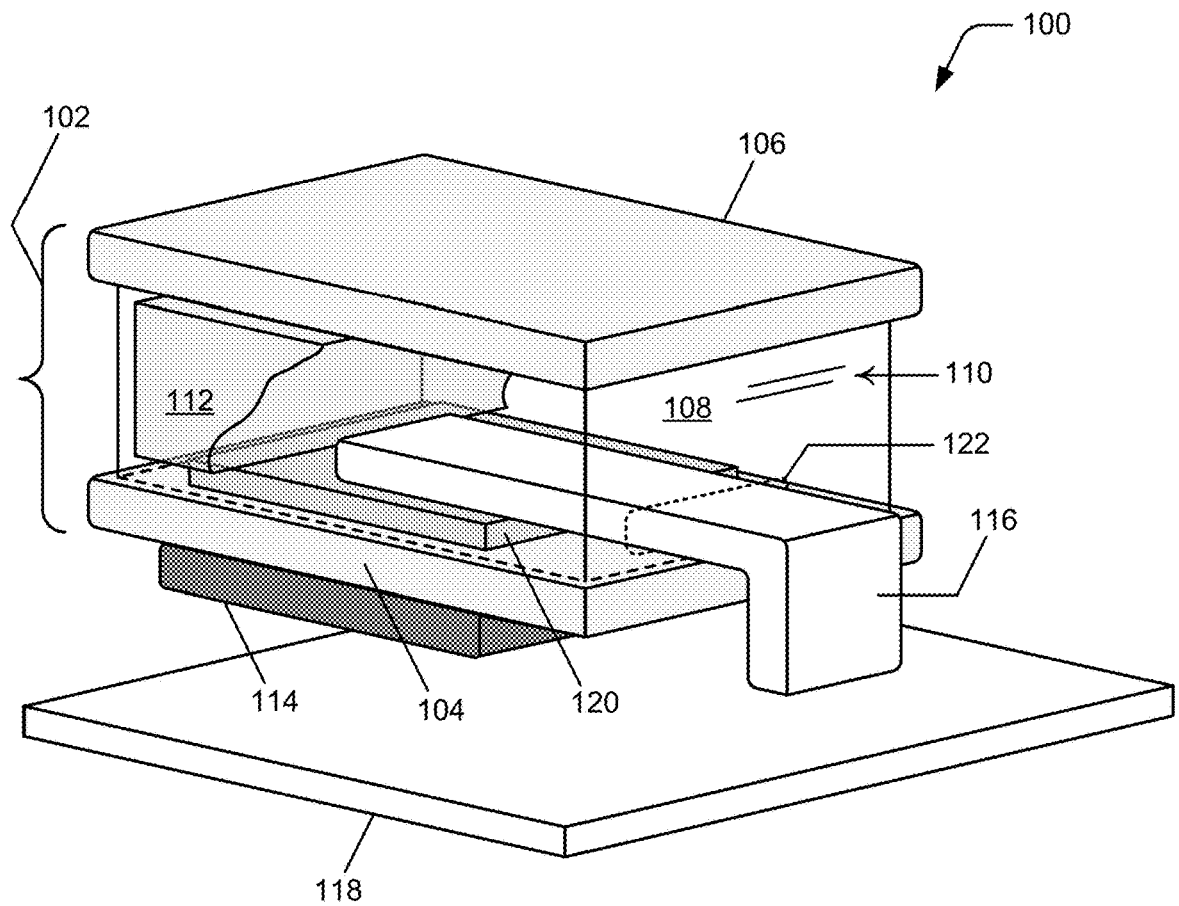
FIG. 1 illustrates an example that supports processor heat dissipation in a stacked PCB configuration in accordance with one or more implementations as described herein.

Implementations of processor heat dissipation in a stacked printed circuit board (PCB) configuration are described, and provide techniques that can be implemented in any type of computing device, such as a wireless device, a smart device, mobile device (e.g., cellular phones, tablet devices, smartphones), consumer electronics, and the like. The techniques are implemented for cooling the processor and other components in a computing device by transferring heat away from the processor to a heat sink. Generally, smaller, mobile device architectures are implemented with a processor that generates the heat, which needs to be dissipated, yet the smaller device configurations are designed with internal components that are installed close together, making dissipation of the generated heat a challenge. Notably, the processor may also have a design specification requiring heat dissipation from both the top and the bottom of the component, yet a stacked printed circuit board (PCB) configuration precludes efficient heat dissipation, particularly on the stacked PCB side of the processor.

In aspects of the described processor heat dissipation in a stacked PCB configuration, a computing device, such as a mobile phone, wireless device, smartphone, or other communication device includes a processor for application processing that produces heat. To efficiently transfer the heat produced by the processor away from the computing device, a heat spreader may be used to transfer heat from the processor to a heat sink. Integrating the heat spreader in the stacked PCB configuration provides an additional path for heat transfer, in addition to cooling through a surface of a printed circuit board to a heat sink.

Unlike some conventional systems, this disclosure provides for heat dissipation in a device using one heat sink (in one example implementation), which facilitates device assembly. This also alleviates the difficulty of having to attach additional components to the processor while allowing for effective cooling on both sides of the processor. The top of the processor may be cooled conventionally, such as by using a thermally conductive material to create a connection to the heat sink. The bottom of the processor attaches to the main printed circuit board, and heat is transferred through a heat spreader via the main printed circuit board. Integrating a heat spreader with the stacked PCB configuration also eliminates the need to punch holes through the stacked printed circuit boards. This eliminates the restrictions on component design that would otherwise be required to work around the holes in the printed circuit boards.

In aspects of the described disclosure, a computing device has a processor that generates heat, and a stacked PCB configuration, which includes a main printed circuit board and an additional stacked printed circuit board. In implementations, the stacked PCB configuration may include more than two stacked printed circuit boards. The main printed circuit board and the stacked printed circuit board(s) are spaced apart, forming an enclosed cavity between the main printed circuit board and the stacked printed circuit board, with an enclosure material that encompasses or surrounds the enclosed cavity.

In an implementation, a processor is affixed to a side of the main printed circuit board that is opposite and facing away from the stacked printed circuit board in the stacked PCB configuration (e.g., the bottom of the processor attaches to the main printed circuit board). The processor generates heat, which is then transferred from the processor to the attached main printed circuit board and through the attached main printed circuit board into the enclosed cavity. To transfer this heat that is generated by the processor away from the processor and the stacked PCB configuration, a heat spreader is affixed to the main printed circuit board inside of the enclosed cavity. Generally, the heat spreader is an object or material that has a high thermal conductivity and is used as a conductive span between a heat source (e.g., the processor) and a heat exchanger (e.g., a heat sink). In aspects of the disclosure, the heat spreader may be implemented as a solid material, or as any type of a two-phase system, such as a heat-pipe, thermosyphon, vapor-chamber, and the like. The generated heat transfers from the heated end of the heat spreader to the cooler end of the heat spreader.

The heat spreader is connected to the main printed circuit board at a first end with a conductive material that facilitates heat transfer from the main printed circuit board to the heat spreader. A second end of the heat spreader is connected to the heat sink, which can be implemented as a passive heat exchanger that transfers the heat to a cooling medium, such as into the air, a liquid coolant, or another form of cooling medium. The heat spreader exits the enclosed cavity of the stacked PCB configuration via a cavity opening in the enclosed cavity between the main printed circuit board and the stacked printed circuit board.

The heat sink is located external to the stacked PCB configuration and dissipates the heat that is generated by the processor and transferred away from the processor and the stacked printed circuit boards by the heat spreader, allowing for temperature regulation in a device. In an implementation, the heat spreader may be attached to the main printed circuit board at multiple contact points, which allows for increased heat transfer from the processor and the stacked PCB configuration by increasing the number of contact points between the heat spreader and the main printed circuit board. In implementations, the heat sink may be integrated as the internal chassis of a computing device, such as a mobile wireless device, may be implemented as a heat sink separate from the internal chassis of the device, and/or as a combination thereof. In implementations, the internal chassis of a device, the heat sink, and/or the combination thereof can be linked or attached to the external housing of the device to facilitate the heat dissipation into ambient air that is external to the device.

While features and concepts of processor heat dissipation in a stacked PCB configuration can be implemented in any number of different devices, systems, environments, and/or configurations, implementations of processor heat dissipation in a stacked PCB configuration are described in the context of the following example devices, systems, and methods.

FIG. 1 illustrates an example 100 of a stacked printed circuit board (PCB) configuration 102 in which techniques for processor heat dissipation in a stacked PCB configuration can be implemented, as described herein. In this example 100, the stacked PCB configuration 102 includes a main printed circuit board 104 and an additional stacked printed circuit board 106. In alternate implementations, the stacked PCB configuration 102 may include more than two stacked printed circuit boards. As shown in this example 100, the main printed circuit board 104 and the stacked printed circuit board 106 in the stacked PCB configuration 102 are spaced apart in a manner that forms an enclosed cavity 108 between the main printed circuit board 104 and the stacked printed circuit board 106 with an enclosure material 110 that encompasses or surrounds the enclosed cavity 108. In an implementation, the enclosure material 110 can be formed with any type of material utilized to encompass or surround the enclosed cavity 108, such as to create the enclosed cavity 108 as a void space.

In a configuration, the main printed circuit board 104 and the stacked printed circuit board 106 of the stacked PCB configuration 102 can be held spaced apart by an interposer PCB 112 or interconnect board, which is partially shown. In this configuration, the interposer PCB 112 (interconnect board) is attached to the periphery of both the main printed circuit board 104 and the stacked printed circuit board 106, holding the stacked PCB configuration 102 in place and forming the enclosed cavity 108 between the two stacked PCBs. Another example is further shown and described with reference to FIG. 2. In implementations, the enclosed cavity 108 may be maintained as an empty void space between the stacked PCBs. Alternatively, the enclosed cavity 108 may be filled with a thermal paste, a thermal gel, or other type of a solid material to reduce the air gap between the stacked PCBs inside the stacked PCB configuration.

Generally, the stacked PCB configuration 102 may be implemented in a mobile wireless device or other type of computing device to address the space constraints for component configurations, particularly in smaller devices, as well as to decrease interference and noise that may be generated in a wireless communication device. A printed circuit board in the stacked configuration is typically a laminated, layered structure of conductive and insulating layers. Each printed circuit board may contain components in designated locations on the outer layers of the printed circuit board, and generally, each printed circuit board can include electrical connections between various component terminals for connection of the device components. A printed circuit board may also have various conductive layers designed with a pattern of conductors that provide electrical connections on a particular conductive layer. Alternatively or in addition, printed circuit boards may contain vias, which are small holes through the laminate and plated with copper. The vias are then the electrical interconnection between layers that are otherwise insulated in the laminate structure, and provide for connectability between conductive layers of a printed circuit board.

In this example 100, a processor 114 is affixed to a side of the main printed circuit board 104 that is opposite and facing away from the stacked printed circuit board 106 (e.g., the bottom of the processor attaches to the main printed circuit board). The processor 114 may take the form of a microprocessor, a central processing unit, a graphics processing unit, a controller, or any another type of processing device, such as in a mobile wireless device or other type of computing device. The processor 114 executes instructions (e.g., computer-readable instructions) and produces heat in the process, which is transferred from the processor 114 to the attached main printed circuit board 104 and through the attached main printed circuit board into the enclosed cavity 108.

Generally, smaller, mobile device architectures are implemented with a processor 114 that generates heat, which needs to be dissipated, yet the smaller device configurations are designed with internal components that are installed close together, making dissipation of the generated heat a challenge. Notably, the processor 114 may have a design specification requiring heat dissipation from both the top and the bottom of the component, yet the stacked PCB configuration 102 precludes efficient heat dissipation, particularly on the stacked PCB side of the processor, where the bottom of the processor attaches to the main printed circuit board 104.

To transfer this heat that is generated by the processor 114 away from the processor and the stacked PCB configuration 102, a heat spreader 116 is affixed to the main printed circuit board 104 inside of the enclosed cavity 108. Generally, a heat spreader is an object or material that has a high thermal conductivity and is used as a conductive span between a heat source (e.g., the processor 114) and a heat exchanger, such as a heat sink 118 in this example configuration. In implementations, the heat spreader 116 may take the form of a solid material, a hollow tube, or other type of chamber that contains fluid. When one side of the heat spreader 116 is exposed to a heat source, the fluid inside the heated end of the heat spreader transitions to vapor, which migrates to the other end of the heat spreader, where it condenses back to fluid. This is effective to transfer heat from the heated end of the heat spreader 116 to the cooler end of the heat spreader. This process of heat dissipation can be implemented with any number and/or type of heat spreaders, including, but not limited to, a two-phase spreader system, a vapor chamber, a heat pipe, a thermosyphon, and the like.

A first end of the heat spreader 116 is connected to the main printed circuit board 104, such as affixed with a conductive material 120 that facilitates to interface the heat spreader 116 with the main printed circuit board 104. In implementations, the conductive material 120 may be a thermal paste or thermal gel, or alternatively, a copper slug or copper tape, such as may be affixed to the main printed circuit board 104 and/or to the heat spreader 116 by soldered connections. Additionally, the conductive material 120 may be used to account for tolerances and height differences of components on the main printed circuit board 104 in order to avoid interference by the heat spreader 116 with the functionality of other device components, while effectively transferring heat away from the main printed circuit board. A second end of the heat spreader 116 is connected to the heat sink 118 for thermal transfer. The heat sink 118 can be implemented as a passive heat exchanger that transfers heat to a cooling medium, which may be into the air, a liquid coolant, or another form of cooling medium.

In this example 100, the heat spreader 116 exits the enclosed cavity 108 via a cavity opening 122 in the enclosed cavity 108 between the main printed circuit board and the stacked printed circuit board 106 in the stacked PCB configuration 102. In an implementation, this cavity opening 122 may be an opening in the interposer PCB (not shown). The heat sink 118 is located external to the stacked PCB configuration 102, and dissipates the heat that is generated by the processor 114 and transferred away from the processor and the stacked PCBs by the heat spreader 116, allowing for temperature regulation in a device. In implementations, the heat sink 118 can be formed as a metal plate or thin sheet of metal, such as aluminum. Additionally, the heat sink 118 may include fins to increase the exposed surface area for cooling purposes, and/or may also incorporate fans or a liquid cooling process to dissipate the heat. In alternate configurations, a shield structure (not shown) may be used to separate the processor 114 from the heat sink 118 inside of a device. Accordingly, some heat transfer may occur through the shield structure to the heat sink, which facilitates to further cool the device in addition to the heat transfer that occurs from the stacked PCB configuration 102 to the heat sink 118 via the heat spreader 116.

Figure 2:
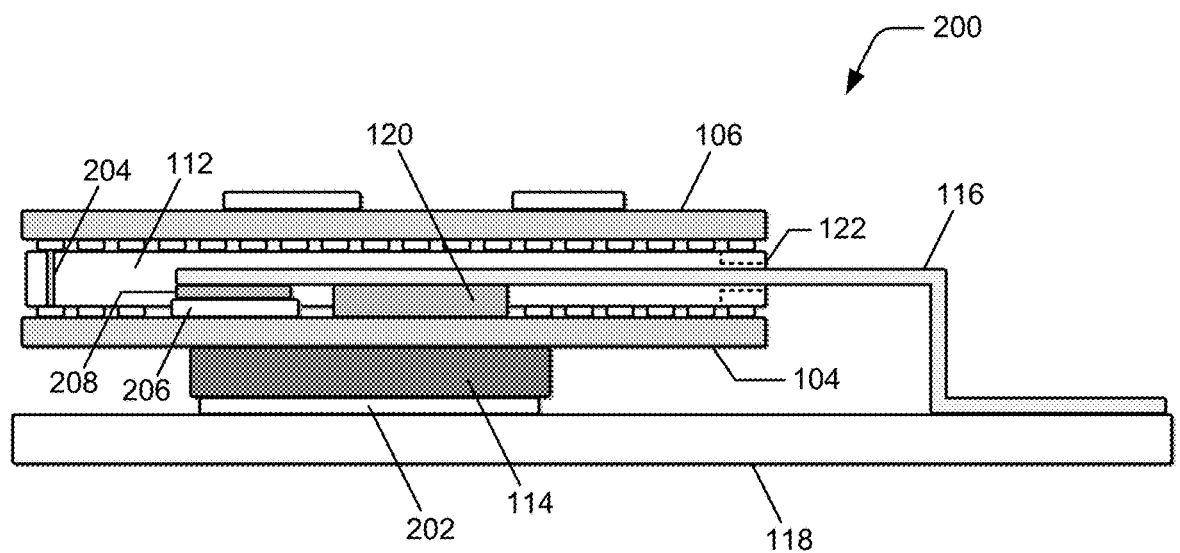
FIG. 2 further illustrates an example that supports processor heat dissipation in a stacked PCB configuration in accordance with one or more implementations as described herein.

FIG. 2 further illustrates an example 200 of features for processor heat dissipation in a stacked PCB configuration, such as described with reference to FIG. 1. In addition to the heat spreader 116 connecting the main printed circuit board 104 to the heat sink 118 via the conductive material 120, additional thermally conductive material 202 may be used to connect the processor 114 directly to the heat sink 118. The additional conductive material 202 facilitates the processor chip dissipating heat through its case (e.g., the top of the processor) directly to the heat sink, which is also further shown and described with reference to FIG. 5. In implementations, the conductive material 202 may be similar or the same as the conductive material 120. For example, the conductive material 202 is a thermal interface material that may be a copper block (or copper slug) and thermal paste, or copper tape and thermal paste, or just thermal paste. Any combination of heat spreader(s), a heat sink, and conductive material configurations may be utilized to transfer and/or dissipate the heat generated in a device.

This example 200 also further illustrates the interposer PCB 112 (interconnect board) which includes PCB interconnects 204 between the main printed circuit board 104 and the stacked printed circuit board 106 to electrically interconnect the printed circuit boards. As further shown and described with reference to FIG. 3, the heat spreader may also be attached to other device components 206 with a thermal interface material 208 (e.g., a copper slug and thermal paste, or just thermal paste) to dissipate heat from the stacked PCB configuration 102.

Figure 3:
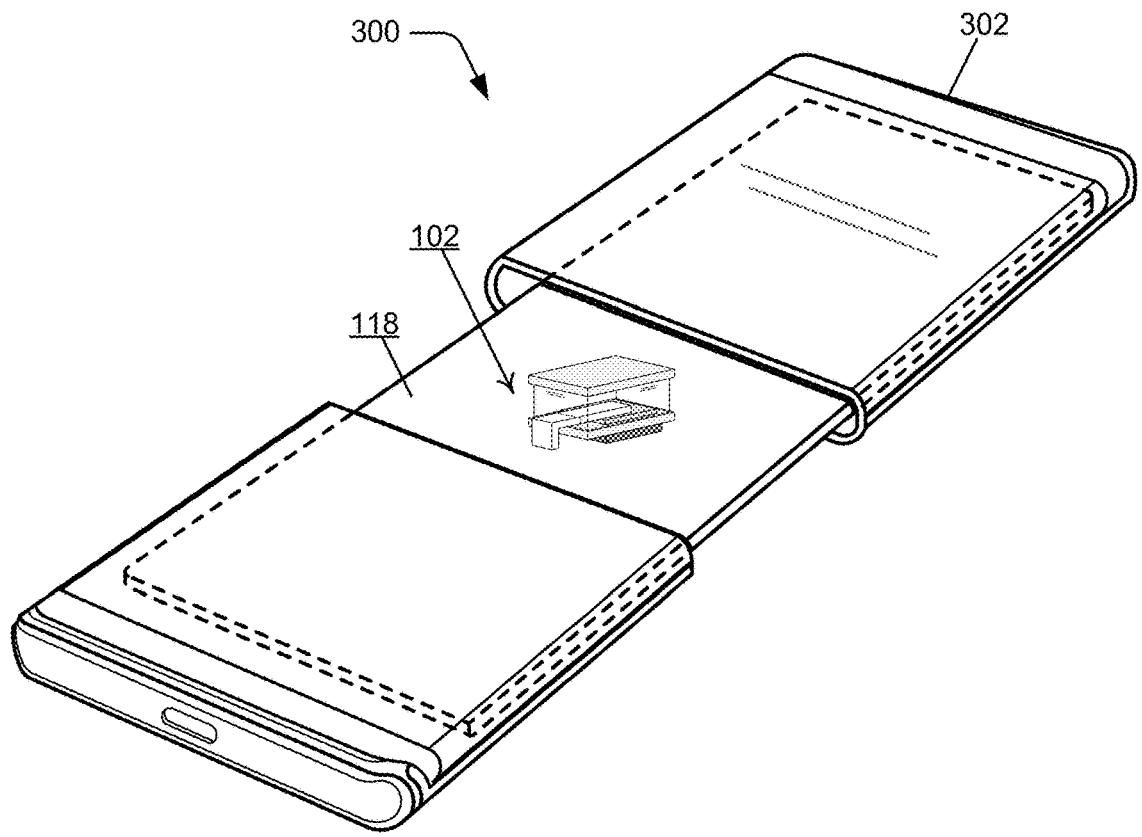
FIG. 3 further illustrates the examples that support processor heat dissipation in a stacked PCB configuration, such as in a computing device in accordance with one or more implementations as described herein.

FIG. 3 further illustrates an example 300 of features for processor heat dissipation in a stacked PCB configuration, as described with reference to FIGS. 1 and 2, implemented in a computing device 302 as shown. As shown in this example 300, the computing device 302 may be any type of a mobile phone, wireless device, smartphone, computing device, tablet device, electronic, and/or communication device implemented with various components, such as an application processor and memory, as well as any number and combination of different components as further described with reference to the example device shown in FIG. 8. In this example 300, the computing device 302 incorporates a processor 114 in a stacked PCB configuration 102, and the processor generates heat that needs to be dissipated, as described with reference to FIGS. 1 and 2.

Generally, the computing device 302 also incorporates an example of the heat sink 118 inside the computing device. Alternatively or in addition, the heat sink 118 may be located external to the computing device 302 (not shown), such as positioned on the periphery of the device, exposing the heat sink to air around the device to increase and facilitate heat dissipation. The heat sink 118 can be implemented as a passive heat exchanger that transfers heat to a cooling medium, which may be into the air external to the device 302, a liquid coolant, or another form of cooling medium.

In implementations, the heat sink 118 can be formed as a metal plate or thin sheet of metal, such as aluminum, and can vary in size, depending on the quantity of heat to be transferred away from the processor 114 and dissipated in the device. For example, the heat sink 118 may have length and width dimensions approximately as large as the footprint of the computing device 302 to effectively dissipate the generated heat. In implementations, heat sink 118 may also have dimensions smaller or greater than the overall size of the computing device 302. Notably, the heat sink 118 can be implemented as the internal chassis of the device 302, may be implemented as a heat sink separate from the internal chassis of the device, and/or a combination thereof. In implementations, the internal chassis of the device, the heat sink, and/or the combination thereof is linked or attached to the external housing of the computing device 302 to facilitate the heat dissipation into ambient air that is external to the device.

Figure 4:
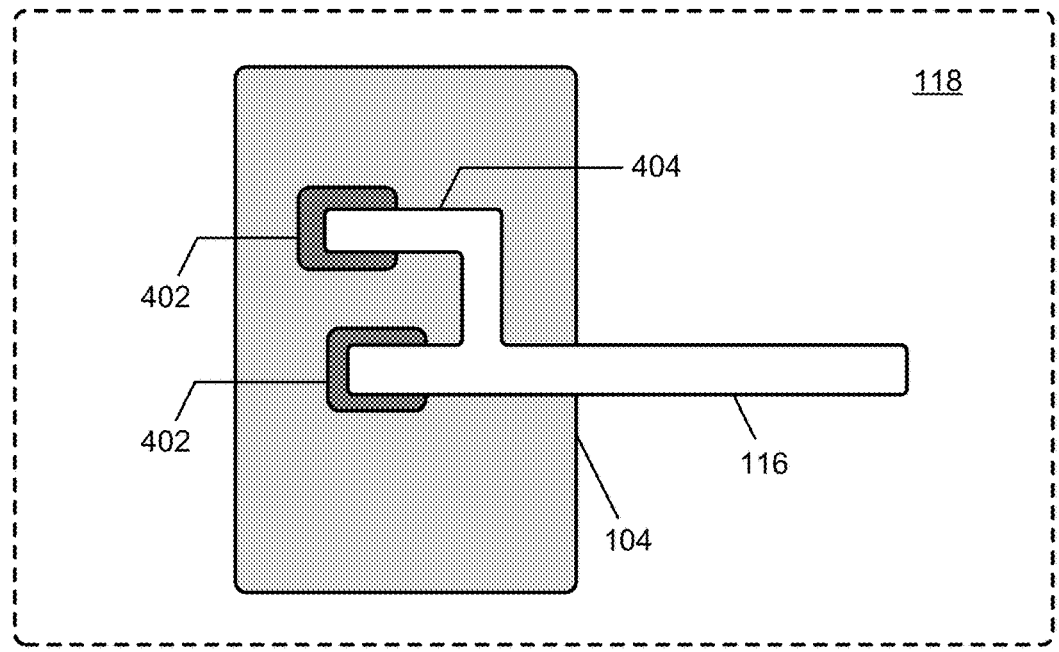
FIG. 4 illustrates another example that supports processor heat dissipation in a stacked PCB configuration in accordance with one or more implementations as described herein.

FIG. 4 illustrates another example 400 of techniques for processor heat dissipation in a stacked PCB configuration, as described with reference to FIGS. 1-3, and implemented in the computing device 302. In this example 400, the heat spreader 116 may be affixed to the main printed circuit board 104 at any number of multiple contact points 402. The heat spreader 116 may have an additional end 404 that allows the heat spreader 116 to connect to the multiple contact points 402 on the main printed circuit board 104. These multiple contact points 402 on the main printed circuit board 104 are in addition to the connection point between the first end of the heat spreader 116 and the main printed circuit board 104, such as shown and described with reference to FIG. 1. In this implementation, the second end of the heat spreader 116 is connected to the heat sink 118, as illustrated in FIG. 1. The multiple contact points 402 of the heat spreader 116 on the main printed circuit board 104 allow for increased heat transfer from the processor 114 and the stacked PCB configuration 102 by increasing the number of connection points via which the heat can transfer between the main printed circuit board 104 and the heat spreader 116.

In implementations, the heat spreader 116 may be affixed to specific contact points of high heat on the main printed circuit board 104. Alternatively or in addition, the heat spreader 116 may be affixed to multiple solid components on the main printed circuit board 104. In implementations, the heat spreader 116 is affixed to the main printed circuit board 104 at multiple contact points 402 with a conductive material 120 that facilitates to interface the heat spreader 116 with the main printed circuit board 104, such as described with reference to FIG. 1. This process of heat dissipation can be implemented with any number and/or type of heat spreaders, including, but not limited to, a two-phase spreader system, a vapor chamber, a heat pipe, a thermosyphon, and the like.

Figure 5:
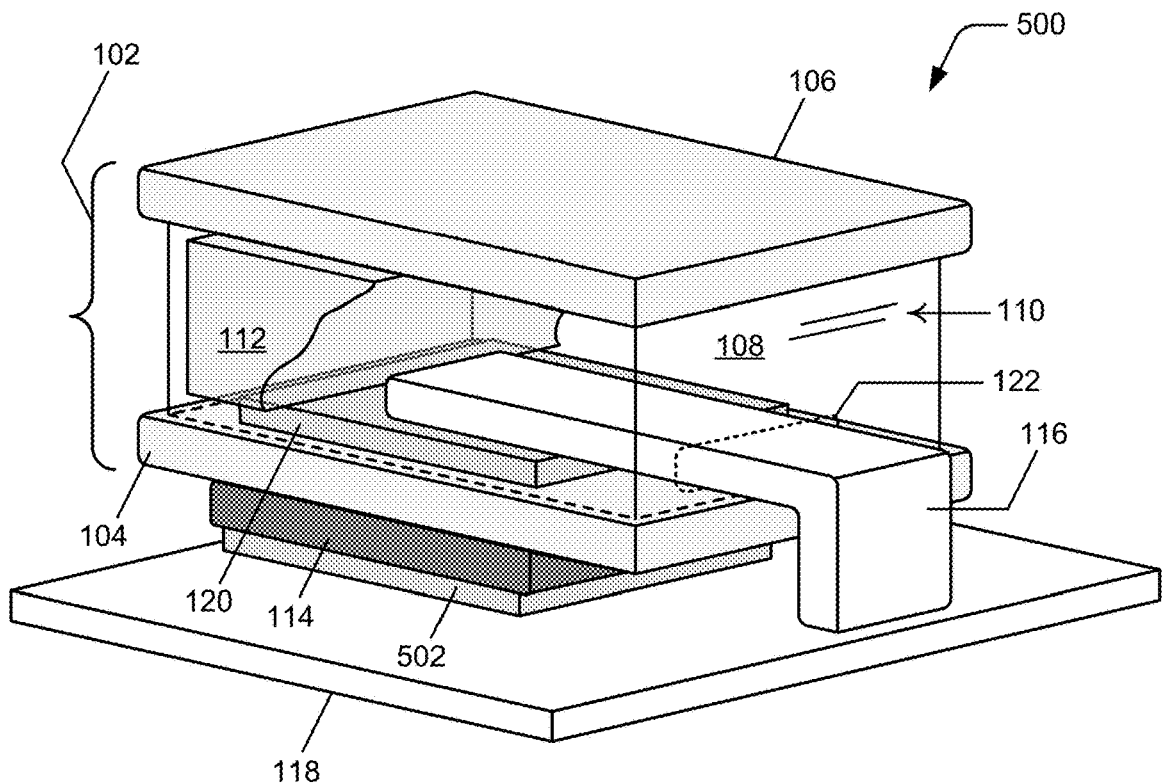
FIG. 5 illustrates another example that supports processor heat dissipation in a stacked PCB configuration in accordance with one or more implementations as described herein.

FIG. 5 further illustrates another example 500 of features for processor heat dissipation in a stacked PCB configuration, such as described with reference to FIGS. 1-4, and implemented in a computing device 302. As shown in this example 500, additional conductive material 502 may be used to connect the processor 114 directly to the heat sink 118, thereby increasing the heat transfer from the processor to the heat sink, in addition to the heat spreader 116 connecting the main printed circuit board 104 to the heat sink 118 via the conductive material 120. The additional conductive material 502 is used to facilitate the processor chip dissipating heat through its case directly to the heat sink. In implementations, the conductive material 502 may be similar or the same as the conductive material 120. It should be noted that this configuration shown and described with reference to FIG. 5 may be combined with an additional heat spreader such as further shown and described with reference to FIG. 6. Any combination of heat spreader(s), a heat sink, and conductive material configurations may be utilized to transfer and/or dissipate the heat generated in a device.

Figure 6:
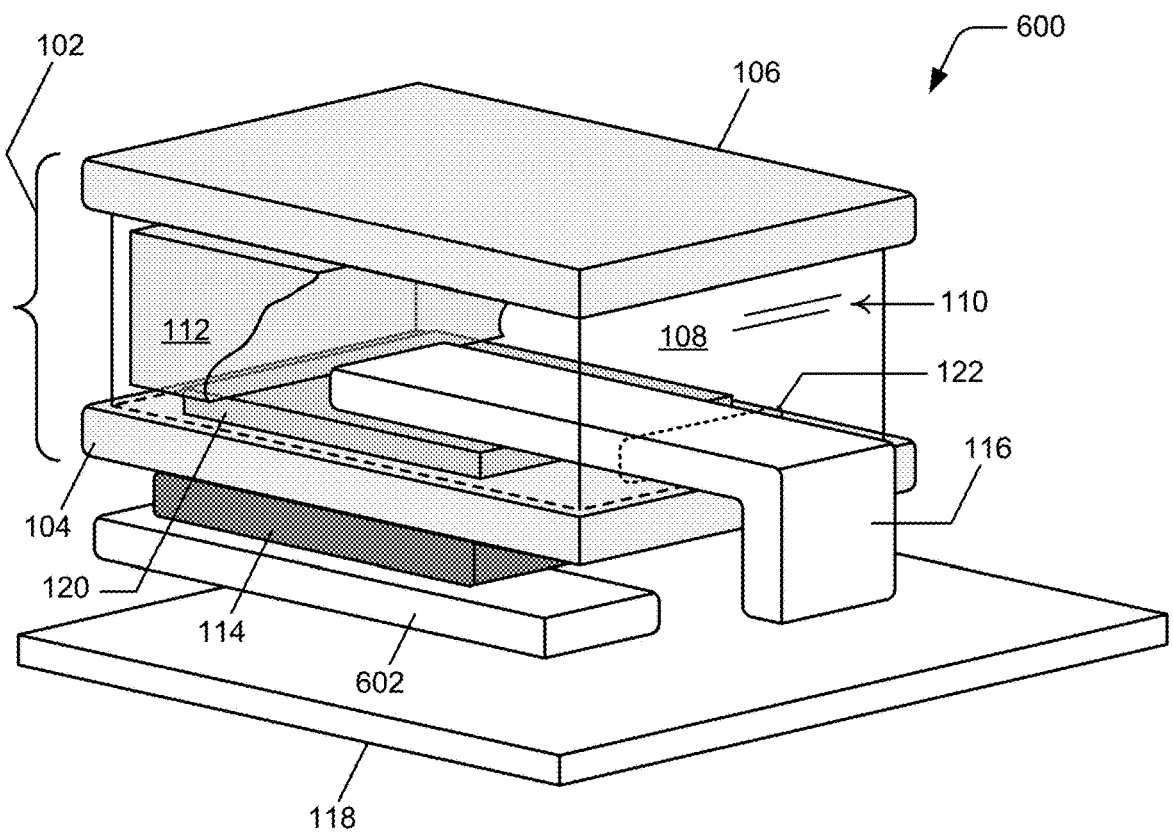
FIG. 6 illustrates another example that supports processor heat dissipation in a stacked PCB configuration in accordance with one or more implementations as described herein.

FIG. 6 further illustrates another example 600 of features for processor heat dissipation in a stacked PCB configuration, such as described with reference to FIGS. 1-4, and implemented in a computing device 302. As shown in this example 600, an additional heat spreader 602 may be used to connect the processor 114 to the heat sink 118 to increase the heat transfer from the processor to the heat sink, in addition to the heat spreader 116 connecting the main printed circuit board 104 to the heat sink 118. Alternatively or in addition, the additional heat spreader 602 may connect the main printed circuit board 104 to the heat sink 118 to increase the connections for heat transfer from the processor 114 to the heat sink 118 via the main printed circuit board.

In implementations, the additional heat spreader 602 may also be integrated with the heat spreader 116. For example, a first end of the additional heat spreader 602 may be connected to the processor 114 via the main printed circuit board 104 using a conductive material 120, and the second end of the additional heat spreader 602 may be connected to the heat spreader 116. In other implementations, the additional heat spreader 602 may alternatively connect to an additional heat sink that is implemented in addition to the heat sink 118. Further, any combination of these heat spreader and heat sink configurations may be utilized to transfer and/or dissipate the heat generated in a device.

Figure 7:
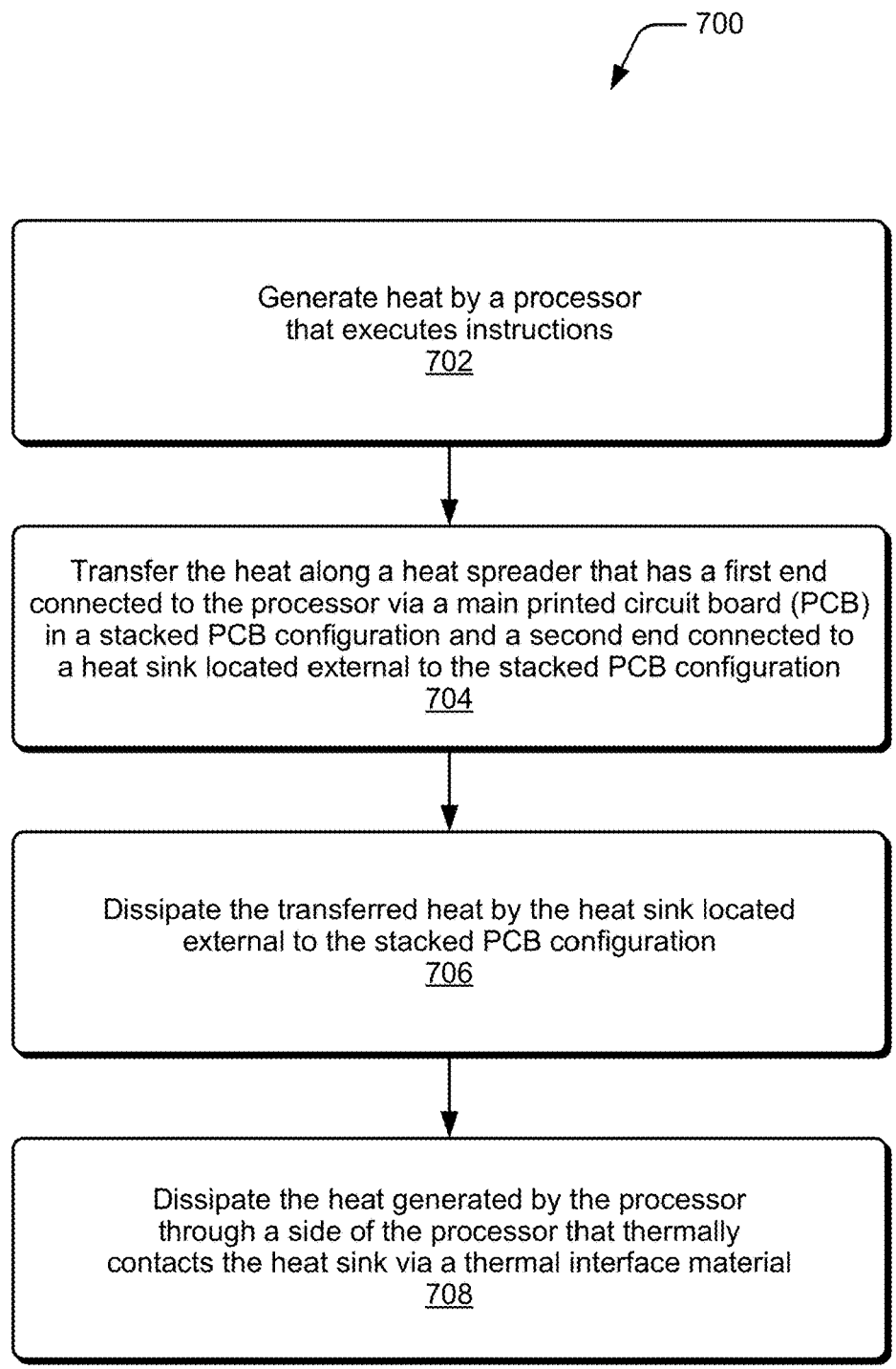
FIG. 7 illustrates example method(s) for processor heat dissipation in a stacked PCB configuration in accordance with one or more implementations of the techniques described herein.

FIG. 7 illustrates example method(s) 700 for processor heat dissipation in a stacked PCB configuration, as described herein, and is generally described with reference to a computing device implemented with a processor that generates heat in the device. The order in which the method is described is not intended to be construed as a limitation, and any number or combination of the described method operations can be performed in any order to perform a method, or an alternate method.

At 702, heat is generated by a processor that executes instructions. For example, the processor 114 executes instructions (e.g., computer-readable instructions) and produces heat in the process, which is transferred from the processor 114 to the attached main printed circuit board 104 and through the attached main printed circuit board into the enclosed cavity 108.

At 704, the heat is transferred along a heat spreader that has a first end connected to the processor via a main printed circuit board (PCB) in a stacked PCB configuration and a second end connected to a heat sink located external to the stacked PCB configuration. For example, the heat spreader 116 is affixed to the main printed circuit board 104 inside of the enclosed cavity 108, and the heat is transferred along the heat spreader 116 that has a first end connected to the processor 114 via the main printed circuit board 104 in the stacked PCB configuration 102, and a second end of the heat spreader is connected to the heat sink 118 located external to the stacked PCB configuration. The heat is transferred along the heat spreader 116 through the opening 122 in the enclosed cavity 108 that is formed between the main printed circuit board 104 and the additional, stacked printed circuit board 106 in the stacked PCB configuration 102.

The heat may be further transferred away from the processor 114 along at least one additional heat spreader. For example, the additional heat spreader 602 may be utilized to connect the processor 114 to the heat sink 118 to increase heat transfer from the processor 114 to the heat sink 118, in addition to the heat spreader 116 connecting the main printed circuit board 104 to the heat sink 118. In other implementations, the heat spreader 116 may be affixed to the main printed circuit board 104 at multiple contact points, which provide for additional heat transfer from the processor 114 and the stacked PCB configuration 102 by increasing the number of connection points between the heat spreader 116 and the main printed circuit board.

At 706, the transferred heat is dissipated by the heat sink located external to the stacked PCB configuration. For example, the heat sink 118 is located external to the stacked PCB configuration 102, and dissipates the heat that is generated by the processor 114 and transferred away from the processor 114 and the stacked printed circuit boards by the heat spreader 116, allowing for temperature regulation in a device.

At 708, the heat generated by the processor is further dissipated through a side of the processor that thermally contacts the heat sink via a thermal interface material. For example, a first side of the processor 114 (e.g., the bottom of the processor) is affixed to the main printed circuit board 104 and a second side of the processor 114 (e.g., the top of the processor) thermally contacts the heat sink 118 via a thermal interface material to further dissipate the heat generated by the processor. In implementations, the thermal interface material may be a copper block (or copper slug) and thermal paste, or copper tape and thermal paste, or just thermal paste.

Figure 8:
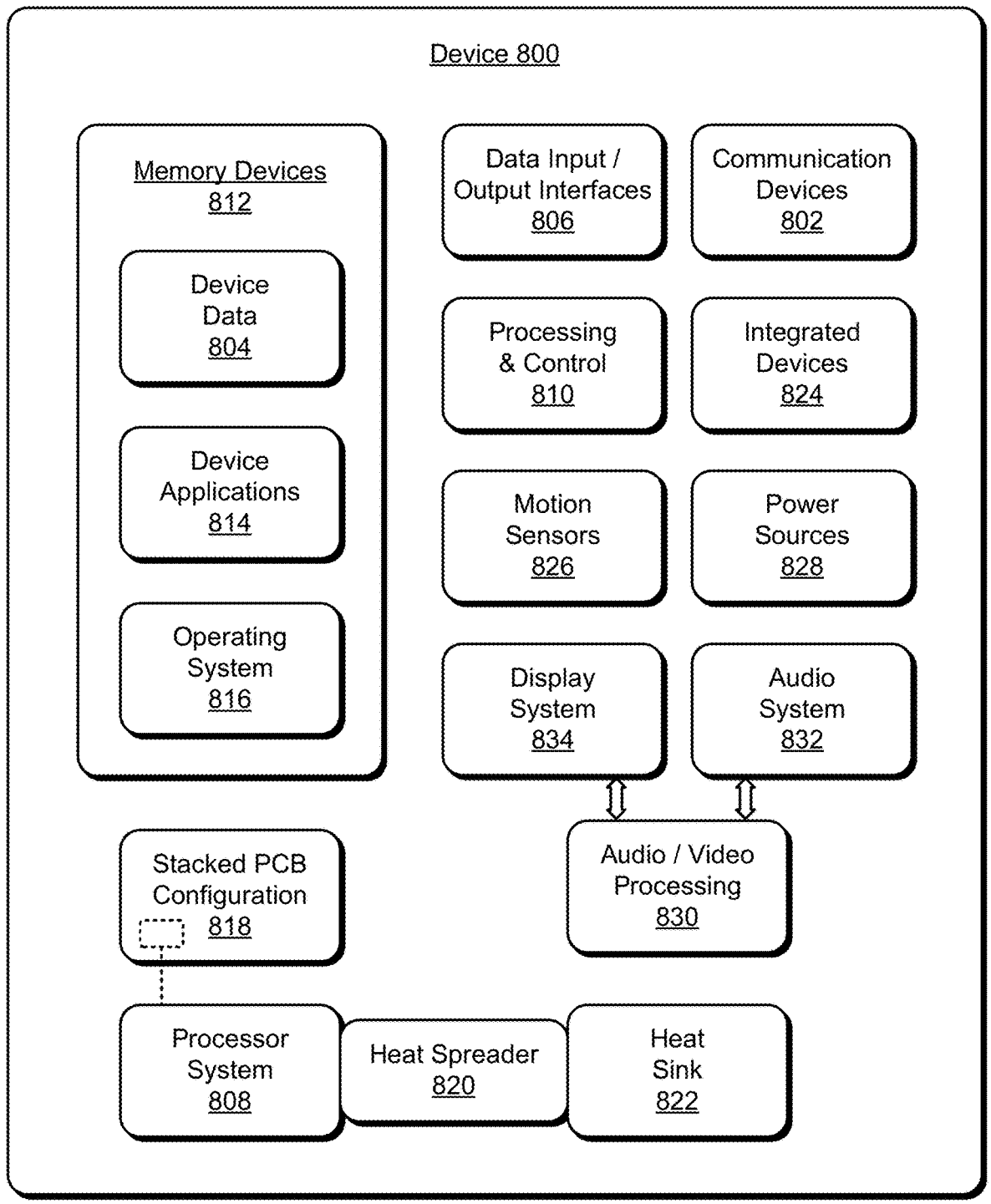
FIG. 8 illustrates various components of an example device that can be used to implement the techniques of processor heat dissipation in a stacked PCB configuration as described herein.

FIG. 8 illustrates various components of an example device 800, which can implement aspects of the techniques and features for processor heat dissipation in a stacked PCB configuration, as described herein. The example device 800 can be implemented as any of the devices described with reference to the previous FIGS. 1-7, such as any type of a wireless device, mobile device, mobile phone, flip phone, client device, companion device, paired device, display device, tablet, computing, communication, entertainment, gaming, media playback, and/or any other type of computing and/or electronic device. For example, the computing device 302 described with reference to FIG. 3 may be implemented as the example device 800.

The example device 800 can include various, different communication devices 802 that enable wired and/or wireless communication of device data 804 with other devices. The device data 804 can include any device data and content that is generated, processed, determined, received, stored, and/or transferred from one computing device to another, and/or synched between multiple computing devices. Generally, the device data 804 can include any form of audio, video, image, graphics, and/or electronic data that is generated by applications executing on a device. The communication devices 802 can also include transceivers for cellular phone communication and/or for any type of network data communication.

The example device 800 can also include various, different types of data input/output (I/O) interfaces 806, such as data network interfaces that provide connection and/or communication links between the devices, data networks, and other devices. The I/O interfaces 806 can be used to couple the device to any type of components, peripherals, and/or accessory devices, such as a computer input device that may be integrated with the example device 800. The I/O interfaces 806 may also include data input ports via which any type of data, information, media content, communications, messages, and/or inputs can be received, such as user inputs to the device, as well as any type of audio, video, image, graphics, and/or electronic data received from any content and/or data source.

The example device 800 includes a processor system 808 of one or more processors (e.g., any of microprocessors, controllers, and the like) and/or a processor and memory system implemented as a system-on-chip (SoC) that processes computer-executable instructions. The processor system may be implemented at least partially in computer hardware, which can include components of an integrated circuit or on-chip system, an application-specific integrated circuit (ASIC), a field-programmable gate array (FPGA), a complex programmable logic device (CPLD), and other implementations in silicon and/or other hardware. Alternatively or in addition, the example device 800 can be implemented with any one or combination of software, hardware, firmware, or fixed logic circuitry that may be implemented in connection with processing and control circuits, which are generally identified at 810. The example device 800 may also include any type of a system bus or other data and command transfer system that couples the various components within the device. A system bus can include any one or combination of different bus structures and architectures, as well as control and data lines.

The example device 800 also includes memory and/or memory devices 812 (e.g., computer-readable storage memory) that enable data storage, such as data storage devices implemented in hardware that can be accessed by a computing device, and that provide persistent storage of data and executable instructions (e.g., software applications, programs, functions, and the like). Examples of the memory devices 812 include volatile memory and non-volatile memory, fixed and removable media devices, and any suitable memory device or electronic data storage that maintains data for computing device access. The memory devices 812 can include various implementations of random-access memory (RAM), read-only memory (ROM), flash memory, and other types of storage media in various memory device configurations. The example device 800 may also include a mass storage media device.

The memory devices 812 (e.g., as computer-readable storage memory) provide data storage mechanisms, such as to store the device data 804, other types of information and/or electronic data, and various device applications 814 (e.g., software applications and/or modules). For example, an operating system 816 can be maintained as software instructions with a memory device and executed by the processor system 808 as a software application. The device applications 814 may also include a device manager, such as any form of a control application, software application, signal-processing and control module, code that is specific to a particular device, a hardware abstraction layer for a particular device, and so on.

In this example, the device 800 also includes the processor system 808 implemented in a stacked PCB configuration 818, such as described with reference to FIGS. 1-7. In the stacked PCB configuration 818, a heat spreader 820 is integrated to connect the processor system 808 and/or the stacked PCB configuration 818 to a heat sink 822. The heat spreader transfers generated heat away from the processor system 808, and the heat sink 822 dissipates the heat in the device.

The example device 800 can also include integrated devices 824, such as a microphone and/or camera devices, as well as motion sensors 826, which may be implemented as components of an inertial measurement unit (IMU). The motion sensors 826 can be implemented with various sensors, such as a gyroscope, an accelerometer, and/or other types of motion sensors to sense motion of the device. The motion sensors 826 can generate sensor data vectors having three-dimensional parameters (e.g., rotational vectors in x, y, and z-axis coordinates) indicating location, position, acceleration, rotational speed, and/or orientation of the device. The example device 800 can also include one or more power sources 828, such as when the device is implemented as a wireless device and/or mobile device. The power sources 828 may include a charging and/or power system, and can be implemented as a flexible strip battery, a rechargeable battery, a charged super-capacitor, and/or any other type of active or passive power source.

The example device 800 can also include an audio and/or video processing system 830 that generates audio data for an audio system 832 and/or generates display data for a display system 834. The audio system and/or the display system may include any types of devices or modules that generate, process, display, and/or otherwise render audio, video, display, and/or image data. Display data and audio signals can be communicated to an audio component and/or to a display component via any type of audio and/or video connection or data link. In implementations, the audio system and/or the display system are integrated components of the example device 800. Alternatively, the audio system and/or the display system are external, peripheral components to the example device.

Although implementations of processor heat dissipation in a stacked PCB configuration have been described in language specific to features and/or methods, the appended claims are not necessarily limited to the specific features or methods described. Rather, the specific features and methods are disclosed as example implementations of processor heat dissipation in a stacked PCB configuration, and other equivalent features and methods are intended to be within the scope of the appended claims. Further, various different examples are described and it is to be appreciated that each described example can be implemented independently or in connection with one or more other described examples. Additional aspects of the techniques, features, and/or methods discussed herein relate to one or more of the following:

A computing device, comprising: a processor configured for executable instructions processing during which the processor generates heat; a main printed circuit board (PCB) in a stacked PCB configuration, the processor affixed to the main printed circuit board; and a heat spreader having a first end connected to the processor via the main printed circuit board by a conductive material, and a second end connected to a heat sink located external to the stacked PCB configuration, the heat spreader configured to transfer the heat away from the processor to the heat sink.

Alternatively or in addition to the above described computing device, any one or combination of: the stacked PCB configuration includes the main printed circuit board and at least one additional printed circuit board, and the stacked PCB configuration forms an enclosed cavity between the main printed circuit board and the at least one additional printed circuit board, through which heat dissipation is restricted. The heat spreader exits the enclosed cavity via an opening in the enclosed cavity between the stacked PCB configuration. The computing device further comprising at least one additional heat spreader connected to the heat sink and configured to further transfer the heat away from the processor to the heat sink. The at least one additional heat spreader is integrated with the heat spreader, the at least one additional heat spreader having a first end connected to the processor via the main printed circuit board, and a second end connected to the heat spreader. The conductive material is a copper slug that affixes the processor to the main printed circuit board, and the heat spreader is a heat pipe that transfers the heat away from the processor to the heat sink. A first side of the processor is affixed to the main printed circuit board and a second side of the processor contacts the heat sink via a thermal interface material. The heat spreader has at least one additional end connected to the processor via the main printed circuit board by the conductive material. The at least one additional end of the heat spreader connects to a different location on the main printed circuit board than the first end of the heat spreader.

A system, comprising: a processor configured for executable instructions processing during which the processor generates heat; a stacked printed circuit board (PCB) configuration, the processor affixed to a main printed circuit board of the stacked PCB configuration; a heat sink configured to dissipate heat away from the processor; and a heat spreader having a first end connected to the processor via the main printed circuit board by a conductive material, the heat spreader configured to transfer the heat away from the processor to a second end of the heat spreader, the second end connected to the heat sink located external to the stacked PCB configuration.

Alternatively or in addition to the above described system, any one or combination of: the stacked PCB configuration includes the main printed circuit board and at least one additional printed circuit board, and the stacked PCB configuration forms an enclosed cavity between the main printed circuit board and the at least one additional printed circuit board, through which heat dissipation is restricted. The heat spreader exits the enclosed cavity via an opening in the enclosed cavity between the stacked PCB configuration. A first side of the processor is affixed to the main printed circuit board and a second side of the processor contacts the heat sink via a thermal interface material. The system further comprising at least one additional heat spreader connected to the heat sink and configured to further transfer the heat away from the processor to the heat sink, the at least one additional heat spreader being integrated with the heat spreader, wherein the at least one additional heat spreader has a first end connected to the processor via the main printed circuit board, and has a second end connected to the heat spreader. The heat spreader is a heat pipe that transfers the heat away from the processor to the heat sink. The heat spreader has at least one additional end connected to the processor via the main printed circuit board by the conductive material.

A method, comprising: generating heat by a processor that executes instructions; transferring the heat along a heat spreader that has a first end connected to the processor via a main printed circuit board (PCB) in a stacked PCB configuration and a second end connected to a heat sink located external to the stacked PCB configuration; and dissipating the transferred heat by the heat sink located external to the stacked PCB configuration.

Alternatively or in addition to the above described method, any one or combination of: the heat is transferred along the heat spreader through an opening in an enclosed cavity formed between the main printed circuit board and at least one additional printed circuit board in the stacked PCB configuration. The heat is further transferred away from the processor along at least one additional heat spreader. At least one additional end of the heat spreader connects to a different location on the main printed circuit board than the first end of the heat spreader.

The invention claimed is:
1. A computing device, comprising:
a processor configured for executable instructions processing during which the processor generates heat;
a main printed circuit board (PCB) in a stacked PCB configuration that includes at least one additional printed circuit board, the processor affixed to the main printed circuit board, the stacked PCB configuration forming an enclosed cavity between the main printed circuit board and the at least one additional printed circuit board, through which heat dissipation is restricted; and
a heat spreader having a first end and at least one additional end connected to the processor via the main printed circuit board by a conductive material, and a second end connected to a heat sink located external to the stacked PCB configuration, the heat spreader exiting the enclosed cavity via an opening in the enclosed cavity between the stacked PCB configuration, and the heat spreader configured to transfer the heat away from the processor to the heat sink.

2. The computing device of claim 1, further comprising at least one additional heat spreader connected to the heat sink and configured to further transfer the heat away from the processor to the heat sink.

3. The computing device of claim 2, wherein the at least one additional heat spreader is integrated with the heat spreader, the at least one additional heat spreader having a first end connected to the processor via the main printed circuit board, and a second end connected to the heat spreader.

4. The computing device of claim 1, wherein:
the conductive material is a copper slug that affixes the processor to the main printed circuit board; and
the heat spreader is a heat pipe that transfers the heat away from the processor to the heat sink.

5. The computing device of claim 1, wherein a first side of the processor is affixed to the main printed circuit board and a second side of the processor contacts the heat sink via a thermal interface material.

6. The computing device of claim 1, wherein the at least one additional end of the heat spreader connects to a different location on the main printed circuit board than the first end of the heat spreader.

7. A system comprising:
a processor configured for executable instructions processing during which the processor generates heat;
a stacked printed circuit board (PCB) configuration that includes a main printed circuit board and at least one additional printed circuit board, the processor affixed to the main printed circuit board, the stacked PCB configuration forming an enclosed cavity between the main printed circuit board and the at least one additional printed circuit board, through which heat dissipation is restricted;
a heat sink configured to dissipate the heat away from the processor; and
a heat spreader having a first end and at least one additional end connected to the processor via the main printed circuit board by a conductive material, the heat spreader configured to transfer the heat away from the processor to a second end of the heat spreader, the second end connected to the heat sink located external to the stacked PCB configuration, and the heat spreader exiting the enclosed cavity via an opening in the enclosed cavity between the stacked PCB configuration.

8. The system of claim 7, wherein a first side of the processor is affixed to the main printed circuit board and a second side of the processor contacts the heat sink via a thermal interface material.

9. The system of claim 7, further comprising at least one additional heat spreader connected to the heat sink and configured to further transfer the heat away from the processor to the heat sink, the at least one additional heat spreader being integrated with the heat spreader, wherein the at least one additional heat spreader has a first end connected to the processor via the main printed circuit board, and has a second end connected to the heat spreader.

10. The system of claim 7, wherein the heat spreader is a heat pipe that transfers the heat away from the processor to the heat sink.

11. The system of claim 7, wherein the conductive material is a copper slug that affixes the processor to the main printed circuit board.

12. The system of claim 7, wherein the at least one additional end of the heat spreader connects to a different location on the main printed circuit board than the first end of the heat spreader.

13. A method, comprising:
generating heat by a processor that executes instructions;
transferring the heat along a heat spreader that has a first end connected to the processor via a main printed circuit board (PCB) in a stacked PCB configuration and a second end connected to a heat sink located external to the stacked PCB configuration, at least one additional end of the heat spreader connecting to a different location on the main printed circuit board than the first end of the heat spreader, the heat being transferred along the heat spreader through an opening in an enclosed cavity formed between the main printed circuit board and at least one additional printed circuit board in the stacked PCB configuration; and
dissipating the transferred heat by the heat sink located external to the stacked PCB configuration.

14. The method of claim 13, wherein the heat is further transferred away from the processor along at least one additional heat spreader.

15. The method of claim 14, wherein the at least one additional heat spreader is integrated with the heat spreader, the at least one additional heat spreader having a first end connected to the processor via the main printed circuit board, and a second end connected to the heat spreader.

16. The method of claim 13, wherein the first end of the heat spreader is connected to the processor via the main printed circuit board by a conductive material.

17. The method of claim 16, wherein the conductive material is a copper slug that affixes the processor to the main printed circuit board.

18. The method of claim 13, wherein the heat spreader is a heat pipe that transfers the heat away from the processor to the heat sink.

19. The method of claim 13, wherein a first side of the processor is affixed to the main printed circuit board and a second side of the processor contacts the heat sink via a thermal interface material.

* * * * *